(12) United States Patent
Di Biccari

(10) Patent No.: US 12,745,464 B2
(45) Date of Patent: Sep. 22, 2026

(54) ELECTROSTATIC DISCHARGE (ESD) PROTECTION CIRCUIT INCLUDING AN AVALANCHE SEMICONDUCTOR CONTROLLED RECTIFIER (SCR) WITH PARALLEL CONNECTED STATIC TRIGGER CONTROL CIRCUIT (TCC)

(71) Applicant: STMicroelectronics International N.V., Geneva (CH)

(72) Inventor: Leonardo Di Biccari, Monza (IT)

(73) Assignee: STMicroelectronics International N.V., Geneva (CH)

( * ) Notice: Subject to any disclaimer, the term of this patent is extended or adjusted under 35 U.S.C. 154(b) by 456 days.

(21) Appl. No.: 18/215,899

(22) Filed: Jun. 29, 2023

(65) Prior Publication Data

US 2025/0006724 A1 Jan. 2, 2025

(51) Int. Cl.
*H10D 89/60* (2025.01)

(52) U.S. Cl.
CPC .................................. *H10D 89/713* (2025.01)

(58) Field of Classification Search
CPC ........ H10D 89/713; H10D 8/80; H02H 9/046; H10F 39/807; H10F 39/011; H10F 39/811; H10F 39/809
See application file for complete search history.

(56) References Cited

U.S. PATENT DOCUMENTS 5,012,317 A 4/1991 Rountre
5,548,135 A 8/1996 Avery
7,471,493 B1 12/2008 Huang et al.
7,548,401 B2 6/2009 Mergens et al.
8,218,276 B2 7/2012 Mallikarjunaswamy
8,493,705 B2 7/2013 Lin et al.
10,079,227 B2 9/2018 Xiu et al.
10,381,340 B2 8/2019 Lai
(Continued)

FOREIGN PATENT DOCUMENTS

CN 114759026 A * 7/2022 ........... H10D 89/921

OTHER PUBLICATIONS

"Novel Diode-Chain Triggering SCR Circuits for ESD Protection," National Taiwan University of Science and Technology, Jul. 2000, 7 pgs.

(Continued)

*Primary Examiner* — Fernando L Toledo
*Assistant Examiner* — Marshall Mu-Nuo Hatfield
(74) *Attorney, Agent, or Firm* — Crowe & Dunlevy LLC

(57) ABSTRACT

A two terminal semiconductor controlled rectifier (SCR) device has an anode terminal coupled to a first node and a cathode terminal coupled to a second node. Neither of the cathode gate or anode gate of the SCR device are connected to a triggering circuit for controlling turn on of the SCR device. The SCR device has an avalanche breakdown voltage for turn on, where that avalanche breakdown voltage is set by a breakdown avalanche of a PN junction of the SCR device. A circuit path includes a series connected chain of M Zener diodes with a blocking diode that are coupled between the first node and the second node. The circuit path has an activation voltage for turn on, where that activation voltage is dependent on N times a Zener diode reverse breakdown voltage. The activation voltage is less than the avalanche breakdown voltage.

15 Claims, 4 Drawing Sheets

(56) References Cited

U.S. PATENT DOCUMENTS

| | | | | |
|---|---|---|---|---|
| 2008/0180869 | A1 | 7/2008 | Sugahara | |
| 2012/0281329 | A1 | 11/2012 | Mallikarjunaswamy | |
| 2014/0167099 | A1 | 6/2014 | Mergens | |
| 2015/0060941 | A1 | 3/2015 | Hwang | |
| 2015/0069424 | A1* | 3/2015 | Willemen | H10D 89/611 257/84 |
| 2016/0343701 | A1* | 11/2016 | Zhong | H10D 8/80 |
| 2017/0236816 | A1* | 8/2017 | Tsai | H10D 89/921 257/112 |
| 2018/0006448 | A1* | 1/2018 | Glaser | H02H 9/046 |
| 2020/0185378 | A1 | 6/2020 | Arnaud | |
| 2022/0231008 | A1 | 7/2022 | Wang et al. | |
| 2023/0040542 | A1 | 2/2023 | Xu | |

OTHER PUBLICATIONS

"Protecting Sensitive Electronic Circuits Using a Transient Voltage Suppressor Diode," MDE Semiconductor Inc., Jun. 10, 2018, 3 pgs.

A. Tazzoli et al., "Effect of Process Technology Variation on ESD Clamp Parameters", EOS/ESD Symposium 2014, 7 pgs.

B. Keppens et al., "ESD Protection Solutions for High Voltage Technologies" , EOS/ESD Symposium 2004, 10 pgs.

H. Arbess et al., "Combined MOS-IGBT-SCR Structure for a Compact High-Robustness ESD Power Clamp in Smart Power SOI Technology" , IEEE Trans. On Dev. and mat. rel., vol. 14, No. 1, Mar. 2014, 9 pgs.

J. Lee et al., "Novel ESD protection structure with embedded SCR LDMOS for smart power technology", IRPS 2002, 6 pgs.

Y.Xiu et al., "Case Study of DPI Robustness of a MOS-SCR Structure for Automotive Applications", EOS/ESD Symposium 2018, 6 pgs.

Z. Hossain, "Determination of Manufacturing Resurf Process Window for a Robust 700V Double Resurf LDMOS Transistor" , ISPSD 2008, 4 pgs.

EPO Search Report and Written Opinion for counterpart EP Appl. No. 24181046.4, report dated Nov. 8, 2024, 7 pgs.

* cited by examiner

A
200
203
216
222
206
220(M)
210
202a
208
202b
212
220(2)
214
220(1)
K
204

TCC 202b
SCR 200
TCC 202a

ELECTROSTATIC DISCHARGE (ESD) PROTECTION CIRCUIT INCLUDING AN AVALANCHE SEMICONDUCTOR CONTROLLED RECTIFIER (SCR) WITH PARALLEL CONNECTED STATIC TRIGGER CONTROL CIRCUIT (TCC)

TECHNICAL FIELD

The present disclosure generally relates to electrostatic discharge (ESD) protection circuitry for integrated circuit devices.

BACKGROUND

Electrostatic discharge (ESD) protection for the input/output (I/O) and other pins (or pads) of integrated circuits is needed in many applications. This is of special concern for the high voltage (HV) input/output pins used for low capacitive/high speed communications signals (such as for use on data communications bus lines).

Mandatory requirements for HV ESD protection of certain input/output pins of integrated circuit (IC) devices (such as for low capacitive/high speed HV input/output with System-level specifications like IEC 62228-3 and/or SAE J2962) include: low capacitance; limited area occupancy; high current/power capability; and high immunity to different electromagnetic (EM) events such as with different stress rise times and current duration source type (for example, direct power injection testing or transient immunity testing). The HV ESD protection must also exhibit a high immunity and robustness in both the supplied IC case and the unsupplied IC case. Furthermore, high immunity to unwanted triggering is necessary (as in the case, for example, of inductive effects on the input/output pin).

Implementation of integrated HV ESD protection with a low area occupancy (low capacitance) and high robustness (current capability) along with high EM immunity is a challenge. Embodiments described herein address the need for an improved integrated HV ESD protection.

SUMMARY

In an embodiment, an electrostatic discharge (ESD) protection circuit comprises: a first semiconductor controlled rectifier (SCR) device of two terminal type consisting of an anode terminal and a cathode terminal, and wherein said first SCR device has an avalanche breakdown voltage for self-turn on; a first circuit path having a first node and a second node, and wherein said first circuit path has an activation voltage for turn on; wherein the first SCR device and first circuit path are connected in parallel with the anode terminal and the first node coupled to a first pin and with the cathode terminal and the second node coupled to a second pin; and wherein said activation voltage is less than the avalanche breakdown voltage.

In an embodiment, a semiconductor controlled rectifier (SCR) device having an anode terminal directly connected to a first pin of an integrated circuit, a cathode terminal directly connected to a second pin of the integrated circuit, and wherein both a cathode gate node and an anode gate node of the SCR device are not connected to a triggering circuit for controlling turn on of the SCR device; and a circuit path having a first end node directly connected to the first pin of the integrated circuit and a second end directly connected to the second pin of the integrated circuit, wherein said circuit path comprises a series connected chain of M Zener diodes; wherein the SCR device has an avalanche breakdown voltage for turn on, said avalanche breakdown voltage set by a breakdown avalanche of a PN junction of the SCR device; wherein the circuit path has an activation voltage for turn on, said activation voltage being dependent on M times a Zener diode reverse breakdown voltage; and wherein said activation voltage is less than the avalanche breakdown voltage.

BRIEF DESCRIPTION OF THE DRAWINGS

For a better understanding of the embodiments, reference will now be made by way of example only to the accompanying figures in which.

DETAILED DESCRIPTION

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms “front”, “rear”, “top”, “bottom”, “left”, “right”, etc., or relative positions, such as terms “above”, “under”, “upper”, “lower”, etc., or to terms qualifying directions, such as terms “horizontal”, “vertical”, etc., unless specified otherwise, it is referred to the orientation of the drawings.

A semiconductor (silicon) controlled rectifier (SCR) device is a well-known, and widely used, circuit for on-chip electrostatic discharge (ESD) protection. The SCR device is typically connected between a signal (input or output) pin of the integrated circuit and a ground (reference voltage) pin of the integrated circuit.

Figure 1:
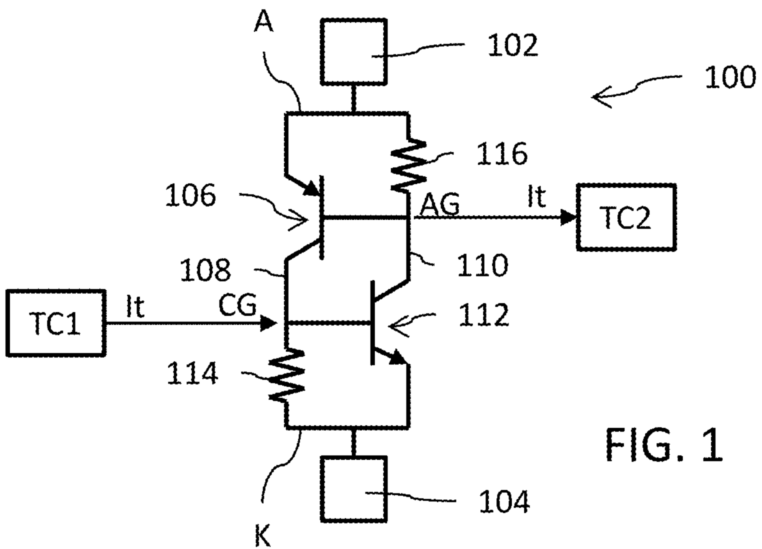
FIG. 1 is a circuit diagram for an electrostatic discharge (ESD) protection circuit using a triggered semiconductor controlled rectifier (SCR) device.

FIG. 1 shows a circuit diagram for an ESD protection circuit using a gate triggered SCR device 100. The SCR device 100 is a three (or more) terminal device that includes an anode node A terminal, a cathode node K terminal, and one or more of an anode gate AG terminal and/or a cathode gate CG terminal. In an ESD protection scheme, the anode node A may be coupled, preferably directly connected, to the signal (input/output) pin 102 and the cathode node K may be coupled, preferably directly connected, to the reference or ground pin 104. A PNP-type bipolar transistor 106 has an emitter coupled, preferably directly connected, to the anode node A, a collector coupled, preferably directly connected, to a first internal base node 108 at the cathode gate CG, and a base coupled, preferably directly connected, to a second internal base node 110 at the anode gate AG. An NPN-type bipolar transistor 112 has a collector coupled, preferably directly connected, to the second internal base node 110 at the anode gate AG, an emitter coupled, preferably directly connected, to the cathode node K, and a base coupled, preferably directly connected, to the first internal base node 108 at the cathode gate CG. A first resistor 114 (provided by a resistance of a doped well in a silicon substrate) has a first terminal coupled, preferably directly connected, to the first internal base node 108 at the cathode gate CG and a second terminal coupled, preferably directly connected, to the cathode node K. A second resistor 116 (provided by a resistance of a doped well in a silicon substrate) has a first terminal coupled, preferably directly connected, to the second internal base node 110 at the anode gate AG and a second terminal coupled, preferably directly connected, to the anode node A.

When the SCR device 100 is in the off-state, the flow of current between the anode node A and the cathode node K is blocked. Turning on the SCR device 100 (i.e., switching from the off-state to the on-state) is typically controlled by the application of a gate signal to either the cathode gate CG at the first internal base node 108 or the anode gate AG at the second internal base node 110 in the presence of a sufficient voltage potential difference between the anode node A and the cathode node K. In the on-state, current flows between the anode node A and the cathode node K until the voltage at the anode node A (referenced to the ground voltage at the cathode node K) falls below a holding voltage level.

For example, turning on the SCR device 100 can be effectuated through the use of a triggering current It that is sourced to the cathode cate CG at the first internal base node 108 by a triggering circuit TC1 (this is referred to in the art as cathode gate controlling the SCR 100). This turns on the NPN-type bipolar transistor 112 and current flows through the collector-emitter path of NPN-type bipolar transistor 112. This current flow sinks current from the base of the PNP-type bipolar transistor 106 and causes the PNP-type bipolar transistor 106 to turn on. The flow of current from the anode node A through the collector-emitter path of PNP-type bipolar transistor 106 is sourced to the base of the NPN-type bipolar transistor 112 and is used to sustain the turn on of the NPN-type bipolar transistor 112. The sourcing of the triggering current It to the cathode gate CG at the first internal base node 108 is then no longer needed for SCR device 100 turn on. The SCR device 100 will remain in the on-state provided sufficient current remains available through the PNP-type bipolar transistor 106 from the anode node A due to the voltage potential difference present between the anode node A and the cathode node K.

Conversely, a triggering current It can be sunk from the anode gate AG at the second internal base node 110 by a triggering circuit TC2 (this is referred to in the art as anode gate controlling the SCR 100). This turns on the PNP-type bipolar transistor 106 and current flows through the collector-emitter path of PNP-type bipolar transistor 106. This current flow sources current to the base of the NPN-type bipolar transistor 112 and causes the NPN-type bipolar transistor 112 to turn on. The flow of current to the cathode node K through the collector-emitter path of NPN-type bipolar transistor 112 is sunk from the base of the PNP-type bipolar transistor 106 and is used to sustain the turn on of the PNP-type bipolar transistor 106. The sinking of the triggering current It from anode gate AG at the second internal base node 110 is then no longer needed for turn on. The SCR device 100 will remain in the on-state provided sufficient current remains available through the PNP-type bipolar transistor 106 from the anode node A due to the voltage potential difference present between the anode node A and the cathode node K.

The triggering circuit TC1, TC2 may be used to sense an ESD event at the pin 102, 104 and generate the required pulse of current It for the triggering signal to control turn on the SCR device 100 in response to that sensed ESD event. The current flowing through the SCR device 100 when turned on will dissipate the ESD stress.

Figure 2:
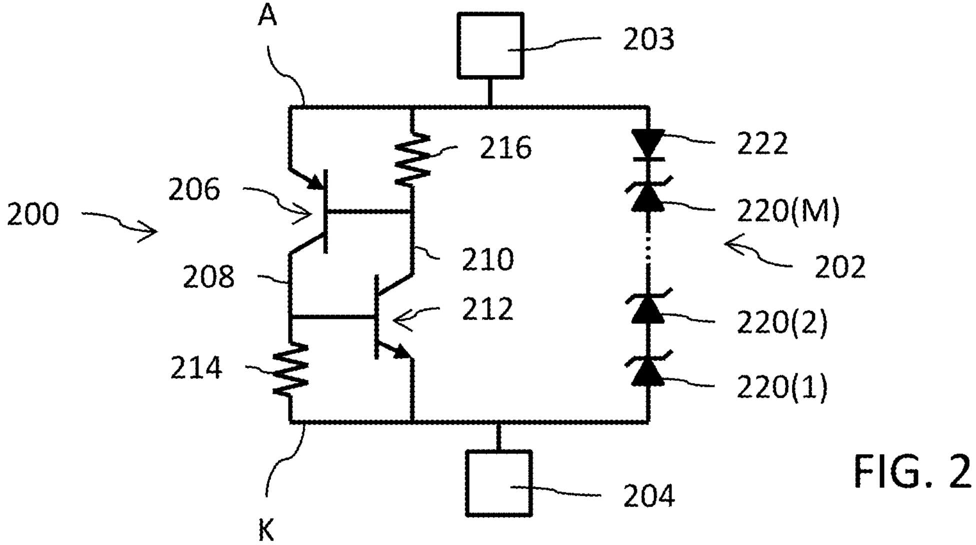
FIG. 2 is a circuit diagram for an ESD protection circuit using an avalanche SCR device and parallel connected static trigger control circuit (TCC)

FIG. 2 is a circuit diagram for an ESD protection circuit using an avalanche SCR device 200 and parallel connected static trigger control circuit (TCC) 202.

The SCR device 200 here is a two terminal device consisting of an anode node A terminal and a cathode node K terminal. A PNP-type bipolar transistor 206 has an emitter coupled, preferably directly connected, to the anode node A, a collector coupled, preferably directly connected, to a first internal base node 208, and a base coupled, preferably directly connected, to a second internal base node 210. An NPN-type bipolar transistor 212 has a collector coupled, preferably directly connected, to the second internal base node 210, an emitter coupled, preferably directly connected, to the cathode node K, and a base coupled, preferably directly connected, to the first internal base node 208. A first resistor 214 (provided by a resistance of a doped well in a silicon substrate) has a first terminal coupled, preferably directly connected, to the first internal base node 208 and a second terminal coupled, preferably directly connected, to the cathode node K. A second resistor 216 (provided by a resistance of a doped well in a silicon substrate) has a first terminal coupled, preferably directly connected, to the second internal base node 210 and a second terminal coupled, preferably directly connected, to the anode node A. In view of the two terminal configuration of the SCR device 200, neither the first internal base node 208 nor the second internal base node 210 are in any way externally (from the perspective of the SCR) connectable or couplable through circuitry (such as trigger circuitry) to the anode terminal or cathode terminal.

The TCC 202, also referred to herein as a circuit path, includes a series connected chain of M Zener diodes 220(1) to 220(M) that are coupled between the anode node A and the cathode node K. The series connection of the Zener diodes 220(1) to 220(M) is in a head-to-tail type connection where the cathode of one Zener diode is directly connected to the anode of the next Zener diode. The anode of the first Zener diode 220(1) in the chain is coupled, preferably directly connected, to the cathode node K. The cathode of the last Zener diode 220(M) is coupled to the anode node A through a blocking diode 222. The cathode of the blocking diode 222 is coupled, preferably directly connected, to the cathode of the last Zener diode 220(M) and the anode of the blocking diode 222 is coupled, preferably directly connected, to the anode node A.

The blocking diode 222 is included to avoid current conduction through the TCC 202 from cathode node K to anode node A during a negative ESD event. The presence of the blocking diode 222 further protects against possible activation of a parasitic conduction path embedded in the integrated circuit structure for the TCC 202. Another advantage of including the diode 222 is that it avoids any issue or constraint in terms of the integrated circuit layout for the TCC 202 due to excessive current/power dissipation at the silicon or metal level.

In an alternative embodiment, the blocking diode 222 is not present in the TCC 202 and the cathode of the last Zener diode 220(M) is directly connected to the anode node A.

In an ESD protection scheme, the anode node A may be coupled, preferably directly connected, to the signal pin 203 (for example, an input/output pin of the integrated circuit) and the cathode node K may be coupled, preferably directly connected, to the reference (ground) pin 204 of the integrated circuit.

It is important to note that the SCR device 200, because it consists of a two terminal device (anode terminal and cathode terminal only), does not include a gate terminal for controlling turn on and thus does not utilize an anode or cathode gate triggering circuit to source/sink a triggering current pulse to either of the first and second internal base nodes 208, 210. Indeed, no circuit connection to a cathode gate or anode gate is made as the SCR device 200 operates independently (i.e., self-turn on and off of the SCR occurs without application of any gate control signaling). To accomplish self-turn on of the SCR device 200 in the ESD protection circuit of FIG. 2 in the absence of an anode gating or cathode gating control signal, a voltage is needed that exceeds the breakdown avalanche of the reverse biased PN junction between the n-type doped region for the collector of the NPN-type bipolar transistor 212 and the p-type doped region for the base of the NPN-type bipolar transistor 212. This voltage is referred to herein as the avalanche breakdown voltage $V_{SCR}$ for the SCR device 200. When this PN junction avalanches, current is sunk from the base of the PNP-type bipolar transistor 206. This turns on the PNP-type bipolar transistor 206 and current flows through the collector-emitter path of PNP-type bipolar transistor 206 to the base of the NPN-type bipolar transistor 212. This base current will control turn on the NPN-type bipolar transistor 212. The flow of current through the collector-emitter path of the turned on NPN-type bipolar transistor 212 then sustains the turn on of the PNP-type bipolar transistor 206. The SCR device 200 will remain in the on-state provided sufficient current remains available through the PNP-type bipolar transistor 206 from the anode node A due to the voltage potential difference present between the anode node A and the cathode node K.

In a preferred implementation of the ESD protection circuit of FIG. 2, the avalanche breakdown voltage $V_{SCR}$ for the SCR device 200 is set to be greater than the activation voltage $V_{TCC}$ of the TCC 202. This is a critical feature for the design of the ESD protection circuit in order to ensure that the TCC 202 turns on (and begins current dissipation) before the SCR device 200 in response to an ESD event.

The setting of the avalanche breakdown voltage $V_{SCR}$ for the SCR device 200 is accomplished by controlling the PNP and NPN junctions of transistors 206 and 212 as well as the value of the parasitic resistance of a doped well in a silicon substrates of resistors 214, 216. This is accomplished, for example, by controlling the size, spacing and doping levels of the doped wells and doped regions in the semiconductor (silicon) layer of the integrated circuit device which form the PNPN structure of the SCR 200. For example, the architecture of the SCR device 200 may be defined with a specific cross section (i.e., number and location of active regions, usage of field plate approach for controlling electric field and potential distribution on silicon). Then, the size, spacing and doping levels of the doped wells and doped regions will set a precise avalanche breakdown voltage for the SCR device 200.

The activation voltage $V_{TCC}$ of the TCC 202 is equal to the sum of the reverse breakdown voltages for the series connected chain of M Zener diodes 220(1) to 220(M) plus the forward voltage drop of the blocking diode 222. The setting of the reverse breakdown voltage for each Zener diode 220 is accomplished by controlling the size, spacing and doping levels of the doped wells, implants and doped regions in the semiconductor substrate of the integrated circuit device which form each diode 220. The forward voltage drop of the blocking diode 222, for example, implemented as a common PN junction, is typically in the range of 0.5 to 0.7 Volts.

The voltage intervention of the TCC 202 for ESD protection, in other words the activation voltage $V_{TCC}$, is defined according to the voltage protection requirements for the signal pin 203 (for example, an input/output pin of the integrated circuit). For example, if voltage protection requirements for the signal pin 203 are for an absolute maximum rating (AMR) of +40 Volts, the TCC 202 may be designed with an activation voltage $V_{TCC}$ of about +45 Volts (i.e., in excess of the AMR). So, there will be no current conduction for ESD protection up to at least the AMR of the pin 203, and the activation voltage $V_{TCC}$ will be set higher than the AMR rating with a suitable margin. For a Zener diode 220 with a reverse breakdown voltage of +5 Volts, the TCC 202 would include a series connected chain of M=9 Zener diodes 220(1) to 220(9) to provide an activation voltage $V_{TCC}$ that is approximately equal to +45 Volts. The SCR device 200 in this example would be designed with an avalanche breakdown voltage $V_{SCR}$ (i.e., the avalanche breakdown of the reverse biased PN junction) for self-turn on of the SCR that is greater than the activation voltage $V_{TCC}$, such as a breakdown voltage that is approximately equal to +51 Volts. The SCR device 200 may further exhibit, in such a case, a threshold voltage for snap-back that is approximately equal to +55 Volts.

It will be noted that there is no operational link between the SCR device 200 and the TCC 202. For example, as noted in connection with the embodiment of FIG. 1, the SCR 200 typically includes an anode or cathode gate triggering circuit. The TCC 202 in FIG. 2 does not function as a trigger for the SCR device 200. The avalanche breakdown voltage $V_{SCR}$ for the SCR device 200, as well as the threshold voltage for snap-back, is defined univocally by the design of the SCR device 200 itself. The SCR device 200 and the TCC 202 are thus independently operated within the ESD protection circuit of FIG. 2.

It will also be noted that the TCC 202 is not a MOS-based semiconductor device. The current in the TCC 202 does not flow through a MOS channel region. Because of this, the TCC 202 is not sensitive to dV/dt concerns or any external fast transient or ringing (with respect to the anode node A or cathode node K) which can be a significant concern when using MOS-based circuits. Operation of the TCC 202 is based solely on the use of PN junctions (with Zener diodes being one example of such a PN junction). As a result, the TCC 202 exhibits a more robust performance against EM or ESD events.

Figures 3, 4A, 4B:
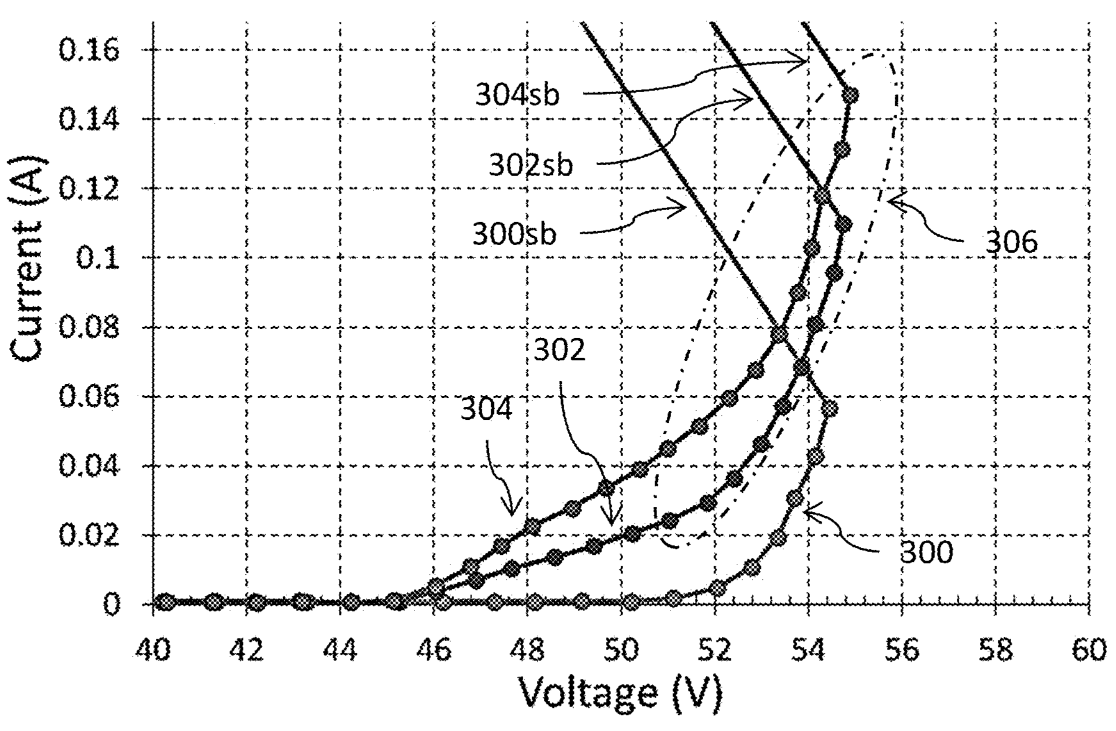
FIG. 3 is current versus voltage plot.
FIG. 4A is a circuit diagram for an ESD protection circuit using an avalanche SCR device and parallel connected static trigger control circuit (TCC)
FIG. 4B shows an example layout configuration for the ESD protection circuit of FIG. 4A.

Reference is now made to FIG. 3 which shows a current versus voltage plot.

Line 300 illustrates the current versus voltage operating characteristic of an ESD protection circuit which uses the avalanche SCR device 200 alone. The SCR circuit 200 is designed with an avalanche breakdown voltage $V_{SCR}$ for self-turn on that is approximately equal to +51 Volts (with a threshold voltage for snap-back of approximately +55 Volts). When the voltage at the signal pin 203 rises to a level where the voltage at the collector of transistor 210 exceeds the avalanche breakdown voltage $V_{SCR}$ of the reverse biased PN junction (about +51 Volts), current through the SCR 200 from signal pin 203 to reference (ground) pin 204 begins to flow. There is an increase in current through the SCR 200 with corresponding increase in voltage at the signal pin 203 until the threshold voltage at about +55 Volts is reached. At this point, the SCR device 200 transitions to operation in snap-back (line 300*sb*).

Line 302 illustrates the current (I) versus voltage (V) operating characteristic of a first embodiment of the ESD protection circuit of FIG. 2 which uses an avalanche SCR device 200 and parallel connected static trigger control circuit (TCC) 202. In this embodiment, the TCC 202 uses a series connected chain of M=9 Zener diodes 220(1) to 220(9), where each Zener diode 220 has a reverse breakdown voltage of +5 Volts and a first size (for example, given by the parameter N=20, where N indicates a number of diode structures connected in parallel for each diode 220). When the voltage at the signal pin 203 rises to a level that exceeds the activation voltage $V_{TCC}$ of the TCC 202 of approximately +45 Volts, current through the TCC 202 from signal pin 203 to the reference (ground) pin 204 begins to flow. The amount of current that flows here is related to the size (N=20) of the Zener diode 220 devices. There is an increase in current through the TCC 202 with corresponding increase in voltage at the signal pin 203 until the voltage at the collector of transistor 210 exceeds the avalanche breakdown voltage $V_{SCR}$ of the reverse biased PN junction (about +51 Volts) for self-turn on of the SCR. At this point an increased level of current flows from signal pin 203 to reference (ground) pin 204 using two current paths-one path through the TCC 202 and another path through the SCR device 200. Thus, the ESD protection circuit of FIG. 2 supports shared current flow with TCC 202 and SCR device 200 in the V-I operating region indicated at reference 306. There is an increase in current flow with corresponding increase in voltage at the signal pin 203 until the threshold voltage level at about +55 Volts is reached. At this point, the SCR device 200 transitions to operation in snap-back (line 302*sb*). After the point where the SCR device 200 transitions to operation in snap-back and the voltage falls below the activation voltage $V_{TCC}$ of the TCC 202, current flow through the TCC 202 terminates and the ESD event discharge is handled solely by the SCR device 200.

Line 304 illustrates the current versus voltage operating characteristic of a second embodiment of the ESD protection circuit of FIG. 2 which uses an avalanche SCR device 200 and parallel connected static trigger control circuit (TCC) 202. In this embodiment, the TCC 202 uses a series connected chain of M=9 Zener diodes 220(1) to 220(9), where each Zener diode 220 has a reverse breakdown voltage of +5 Volts and a second size (for example, given by the parameter N=40, where N indicates the number of diode structures connected in parallel for each Zener diode 220). Thus, the Zener diodes 220 in this embodiment are twice as large as the Zener diodes 220 in the previous embodiment. When the voltage at the signal pin 203 rises to a level that exceeds the activation voltage $V_{TCC}$ of the TCC 202 of approximately +45 Volts, current through the TCC 202 from signal pin 203 to reference (ground) pin 204 begins to flow. The amount of current that flows here is related to the size (N=40) of the Zener diode 220 devices. Note here that because the Zener diodes 220 are larger, there is larger current flow through the TCC 202 in this embodiment compared to the previous embodiment. There is an increase in current through the TCC 202 with corresponding increase in voltage at the signal pin 203 until the voltage at the collector of transistor 210 exceeds the avalanche breakdown voltage $V_{SCR}$ of the reverse biased PN junction (about +51 Volts) for self-turn on of the SCR. At this point an increased level of current flows from signal pin 203 to reference (ground) pin 204 using two current paths-one path through the TCC 202 and another path through the SCR device 200. Thus, the ESD protection circuit of FIG. 2 supports shared current flow with TCC 202 and SCR device 200 in the region indicated at reference 306 which follows the current contribution shown by line 300. There is an increase in current flow with corresponding increase in voltage at the signal pin 203 until the threshold voltage level at about +55 Volts is reached. At this point, the SCR device 200 transitions to operation in snap-back (line 304*sb*). After the point where the SCR device 200 transitions to operation in snap-back and the voltage falls below the activation voltage $V_{TCC}$ of the TCC 202, current flow through the TCC 202 terminates and the ESD event discharge is handled solely by the SCR device 200.

Although a preferred embodiment of the TCC 202 uses Zener diodes 220, it is also possible to instead implement the TCC 202 with another type of avalanche-triggered semiconductor device connected in a series chain. For example, the series connection of Zener diodes 220 could be replaced with a series connection of reverse biased PN diodes (non-limiting examples of which include: high voltage PN diodes; one or more bipolar NPN and PNP transistors in series with shorted base/emitter or base/collector terminals; one or more reverse biased gate-grounded MOS (GGMOS) transistors (i.e., completely turned off with no MOS conduction channel)).

Although a preferred embodiment of the TCC 202 uses a blocking diode 222, it is also possible to instead implement the TCC 202 with another type of current blocking semiconductor device. For example, the blocking diode 222 could be implemented with a PN diode (non-limiting examples of which include: a high voltage PN diode; an NPN or PNP transistor shorted base/emitter or base/collector terminals; a gate-grounded MOS (GGMOS) transistors).

A noted advantage of the ESD protection circuit of FIG. 2 compared to the ESD protection circuit of FIG. 1 is a reduction in occupied integrated circuit area. The SCR device 200 has a size that generally scales with desired current carrying capacity and level of immunity (current value for snap-back). As the protection requirements for the signal pin 203 increase, so does the size of the SCR device 200. Based on immunity requirements, an overdesign of the SCR device in terms of current carrying capacity is possible. For the ESD protection circuit of FIG. 2, however, there are two current conduction paths and the presence of the current conduction path for the TCC 202 eases the design requirements for the SCR device 200 to support operation in the region indicated at reference 306 of FIG. 3. As a result, for a same current carrying capacity requirement, there may be a 15-25% reduction in occupied integrated circuit area by using the ESD protection circuit of FIG. 2.

Reference is now made to FIG. 4A. The ESD protection circuit of FIG. 4A differs from the ESD protection circuit of FIG. 2 only in that a first TCC 202*a* and a second TCC 202*b* are connected in parallel with each other and the two terminal SCR device 200 between the signal pin 203 and reference (ground) pin 204. Each of the first TCC 202*a* and second TCC 202*b* includes a first series connected chain of M Zener diodes 220(1) to 220(M) that are coupled between the anode node A terminal and the cathode node K terminal. The series connection of the Zener diodes 220(1) to 220(M) is in a head-to-tail type connection where the cathode of one Zener diode is directly connected to the anode of the next Zener diode. In each of the first and second TCC 202*a* and 202*b*: the anode of the first Zener diode 220(1) in the chain is coupled, preferably directly connected, to the cathode node K; and the cathode of the last Zener diode 220(M) is coupled to the anode node A through a blocking diode 222 (where the cathode of the blocking diode 222 is coupled, preferably directly connected, to the cathode of the last Zener diode 220(M), and the anode of the blocking diode 222 is coupled, preferably directly connected, to the anode node A).

The use of the first TCC 202*a* and second TCC 202*b* in this configuration is to obtain a more effective connection for the circuit at layout level between the SCR device 200 and the TCC 202. For example, consider that a more uniform trigger mechanism provided by the SCR device 200 and TCC 202 can be obtained by splitting the TCC 202 into two branches (one with TCC 202*a* and another with TCC 202*b*), and connecting those branches in a symmetric way with respect to the layout of the SCR device 200 (for example, relative to the dotted diagonal line across the layout area of the SCR device as shown in FIG. 4B).

Figure 5:
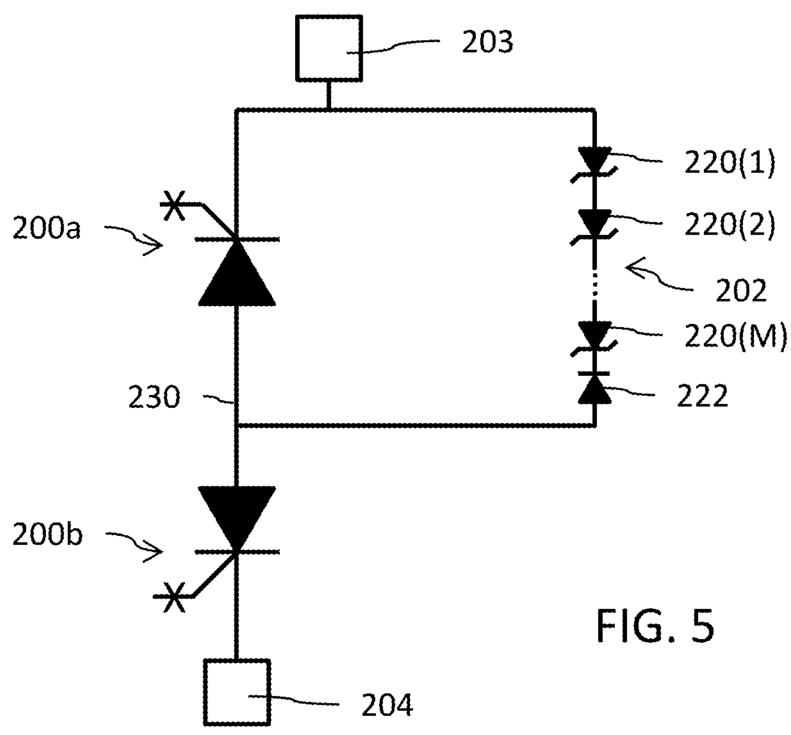
FIGS. 5, 6 and 7 show circuit diagrams for alternative embodiments of the ESD protection circuit.

Reference is now made to FIG. 5 which shows a circuit diagram for another embodiment of an ESD protection circuit. Here, the included two terminal SCR devices 200 are shown by use of their conventional schematic symbols. The SCR device 200*a* has a cathode node K terminal coupled, preferably directly connected, to signal pin 203, an anode node A terminal coupled, preferably directly connected, to intermediate node 230, and a disconnected cathode gate CG (indicated by the "X" for no transistor base access or trigger circuit connection). The SCR device 200*b* has a cathode node K terminal coupled, preferably directly connected, to reference (ground) pin 204, an anode node A terminal coupled, preferably directly connected, to intermediate node 230, and a disconnected cathode gate CG (indicated by the "X" for no transistor base access or trigger circuit connection). Importantly, in view of the two terminal configuration, neither of the SCR devices 200*a*, 200*b* are gate controlled (anode or cathode) by a trigger circuit for turn on in any way (i.e., these SCR devices support self-turn on dependent on applied voltage as discussed above). The TCC 202 is connected between the signal pin 203 and the intermediate node 230. The TCC 202 includes a series connected chain of M Zener diodes 220(1) to 220(M) that are coupled between the signal pin 203 and the intermediate node 230. The series connection of the Zener diodes 220(1) to 220(M) is in a head-to-tail type connection where the cathode of one Zener diode is directly connected to the anode of the next Zener diode. The anode of the first Zener diode 220(1) in the chain is coupled, preferably directly connected, to the pin 203 at the cathode node K of SCR device 200*a*. The cathode of the last Zener diode 220(N) is coupled to the intermediate node 230 through a blocking diode 222. The cathode of the blocking diode 222 is coupled, preferably directly connected, to the cathode of the last Zener diode 220(N) and the anode of the blocking diode 222 is coupled, preferably directly connected, to the intermediate node 230 at the anode node A of SCR device 200*a*. The activation voltage $V_{TCC}$ of the TCC 202 is set to be less than the avalanche breakdown voltage $V_{SCR}$ of the SCR device 200*a*.

Figure 6:
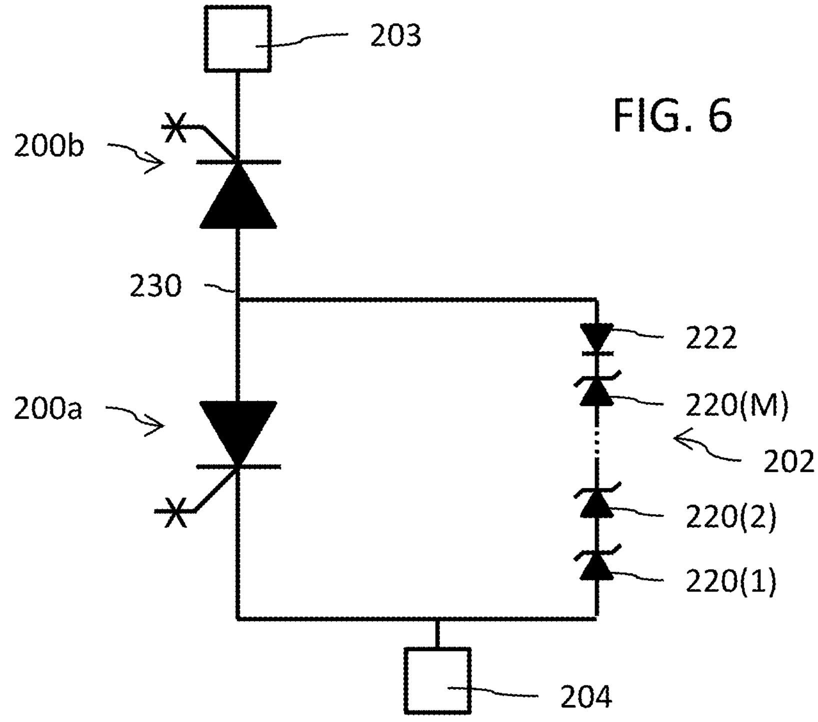

Reference is now made to FIG. 6 which shows a circuit diagram for another embodiment of an ESD protection circuit. Here, the included two terminal SCR devices 200 are shown by use of their conventional schematic symbols. The SCR device 200*a* has a cathode node K terminal coupled, preferably directly connected, to reference (ground) pin 204, an anode node A terminal coupled, preferably directly connected, to intermediate node 230, and a disconnected cathode gate CG (indicated by the "X" for no transistor base access or trigger circuit connection). The SCR device 200*b* has a cathode node K terminal coupled, preferably directly connected, to signal pin 203, an anode node A terminal coupled, preferably directly connected, to intermediate node 230, and a disconnected cathode gate CG (indicated by the "X" for no transistor base access or trigger circuit connection). Importantly, in view of the two terminal configuration, neither of the SCR devices 200*a*, 200*b* are gate controlled (anode or cathode) by a trigger circuit for turn on in any way (i.e., these SCR devices support self-turn on dependent on applied voltage as discussed above). The TCC 202 is connected between the reference (ground) pin 204 and the intermediate node 230. The TCC 202 includes a series connected chain of M Zener diodes 220(1) to 220(M) that are coupled between the reference (ground) pin 204 and the intermediate node 230. The series connection of the Zener diodes 220(1) to 220(M) is in a head-to-tail type connection where the cathode of one Zener diode is directly connected to the anode of the next Zener diode. The anode of the first Zener diode 220(1) in the chain is coupled, preferably directly connected, to the reference (ground) pin 204 at the cathode node K of SCR device 200*a*. The cathode of the last Zener diode 220(M) is coupled to the intermediate node 230 through a blocking diode 222. The cathode of the blocking diode 222 is coupled, preferably directly connected, to the cathode of the last Zener diode 220(M) and the anode of the blocking diode 222 is coupled, preferably directly connected, to the intermediate node 230 at the anode node A of SCR device 200*a*. The activation voltage $V_{TCC}$ of the TCC 202 is set to be less than the avalanche breakdown voltage $V_{SCR}$ of the SCR device 200*a*.

Figure 7:
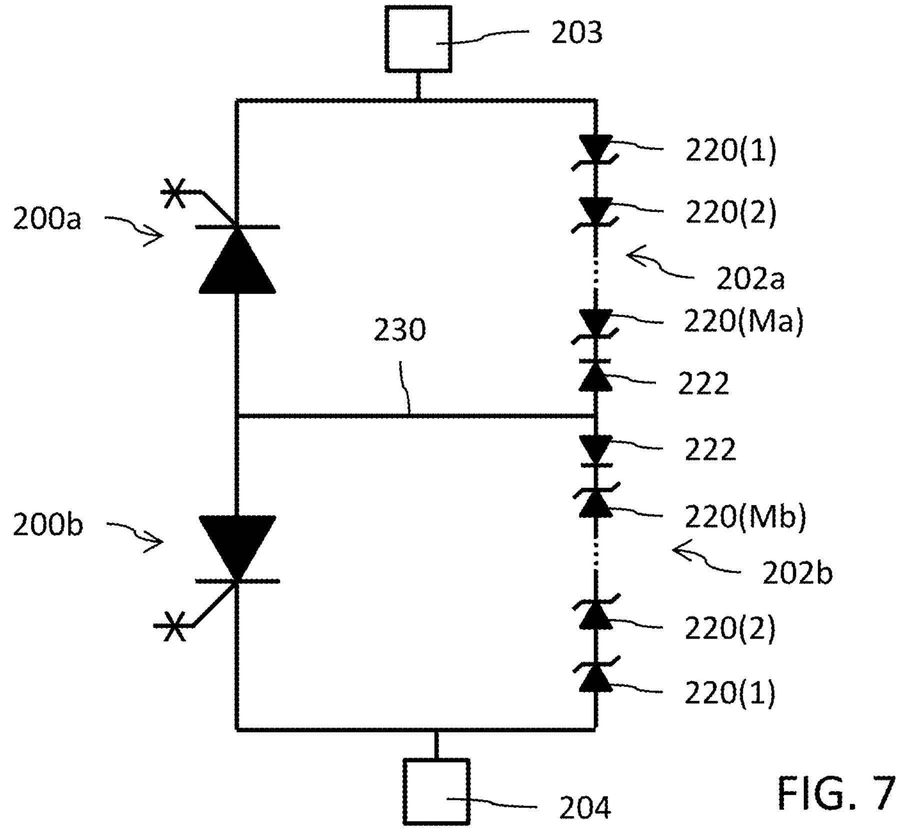

Reference is now made to FIG. 7 which shows a circuit diagram for another embodiment of an ESD protection circuit. Here, the included two terminal SCR devices 200 are shown by use of their conventional schematic symbols. The SCR device 200*a* has a cathode node K terminal coupled, preferably directly connected, to signal pin 203, an anode node A terminal coupled, preferably directly connected, to intermediate node 230, and a disconnected cathode gate (indicated by the "X" for no transistor base access or trigger circuit connection). The SCR device 200*b* has a cathode node K terminal coupled, preferably directly connected, to reference (ground) pin 204, an anode node A terminal coupled, preferably directly connected, to intermediate node 230, and a disconnected cathode gate (indicated by the "X" for no transistor base access or trigger circuit connection). Importantly, in view of the two terminal configuration, neither of the SCR devices 200*a*, 200*b* are gate controlled by a trigger circuit for turn on in any way (i.e., these SCR devices support self-turn on dependent on applied voltage as discussed above).

A first TCC 202*a* is connected between the signal pin 203 and the intermediate node 230. The first TCC 202*a* includes a series connected chain of Ma Zener diodes 220(1) to 220(Ma) that are coupled between the signal pin 203 and the intermediate node 230. The series connection of the Zener diodes 220(1) to 220(Ma) is in a head-to-tail type connection where the cathode of one Zener diode is directly connected to the anode of the next Zener diode. The anode of the first Zener diode 220(1) in the chain is coupled, preferably directly connected, to signal pin 203 at the cathode of SCR device 200*a*. The cathode of the last Zener diode 220(Ma) is coupled to the intermediate node 230 through a blocking diode 222. The cathode of the blocking diode 222 is coupled, preferably directly connected, to the cathode of the last Zener diode 220(Ma) and the anode of the blocking diode 222 is coupled, preferably directly connected, to the intermediate node 230 at the anode node A of SCR device 200a. The activation voltage VTCC of the TCC 202a is set to be less than the avalanche breakdown voltage VSCR of the SCR device 200a.

A second TCC 202b is connected between the reference (ground) pin 204 and the intermediate node 230. The TCC 202b includes a series connected chain of Mb Zener diodes 220(1) to 220(Mb) that are coupled between the reference (ground) pin 204 and the intermediate node 230. The series connection of the Zener diodes 220(1) to 220(Mb) is in a head-to-tail type connection where the cathode of one Zener diode is directly connected to the anode of the next Zener diode. The anode of the first Zener diode 220(1) in the chain is coupled, preferably directly connected, to the reference (ground) pin 204 at the cathode node K of the SCR device 202b. The cathode of the last Zener diode 220(Mb) is coupled to the ground pin 204 through a blocking diode 222. The cathode of the blocking diode 222 is coupled, preferably directly connected, to the cathode of the last Zener diode 220(Mb) and the anode of the blocking diode 222 is coupled, preferably directly connected, to the intermediate node 230 at the anode node A of SCR device 200b. The activation voltage $V_{TCC}$ of the TCC 202b is set to be less than the avalanche breakdown voltage $V_{SCR}$ of the SCR device 200b.

It will be noted that Ma and Mb do not have to be equal to each other. In the case where Ma and Mb are not equal, the activation voltages $V_{TCC}$ of the TCC 202a and TCC 202b will likewise not be equal. In such a case, the avalanche breakdown voltages $V_{SCR}$ of the SCR device 200a and SCR device 200b will likewise not be equal and should be aligned with appropriate margins relative to the activation voltages $V_{TCC}$. In other embodiments, Ma and Mb are equal, and the activation voltages $V_{TCC}$ of the TCC 202a and TCC 202b will be equal. In this case, the avalanche breakdown voltages $V_{SCR}$ of the SCR device 200a and SCR device 200b will be equal and aligned with appropriate margins relative to the activation voltages $V_{TCC}$.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An electrostatic discharge (ESD) protection circuit, comprising:
- a first semiconductor controlled rectifier (SCR) device of two terminal, self-turn on, type consisting of an anode terminal and a cathode terminal, and wherein said first SCR device has an avalanche breakdown voltage for self-turn on;
- wherein said avalanche breakdown voltage is set by a breakdown avalanche of a PN junction of the first SCR device;
- wherein the first SCR device includes an NPN-type bipolar transistor coupled to a PNP-type bipolar transistor, and wherein said PN junction of the first SCR device is a junction between a collector and base of the NPN-type bipolar transistor;
- a first circuit path having a first node and a second node, and wherein said first circuit path has an activation voltage for turn on;
- wherein the first SCR device and first circuit path are connected in parallel with the anode terminal and the first node coupled to a first pin and with the cathode terminal and the second node coupled to a second pin;
- wherein said activation voltage is less than the avalanche breakdown voltage;
- wherein the first circuit path comprises a series connected chain of M Zener diodes that are coupled between the anode terminal and the cathode terminal of the first SCR device, with each Zener diode has a size N greater than or equal to 20, where N is a number of diode structures connected in parallel for each Zener diode.

2. The ESD protection circuit of claim 1, wherein both a cathode gate node and an anode gate node of the first SCR device are not connected to a triggering circuit for controlling turn on of the first SCR device.

3. The ESD protection circuit of claim 1, wherein said activation voltage of the first circuit path is dependent on M times a reverse breakdown voltage of the Zener diode.

4. The ESD protection circuit of claim 3, wherein said first circuit path further includes a diode directly connected in series with the series connected chain of M Zener diodes.

5. The ESD protection circuit of claim 4, wherein a cathode of the diode faces the cathode of the Zener diode in said series connected chain of M Zener diodes to which said diode is directly connected.

6. The ESD protection circuit of claim 1, further comprising a second SCR device of two terminal type consisting of an anode terminal and a cathode terminal, and wherein the anode terminal of the second SCR device is coupled to the anode terminal of the first SCR device, and wherein the cathode terminal of the second SCR device is coupled to the first pin.

7. The ESD protection circuit of claim 6, wherein the first pin is a signal pin for input/output of an integrated circuit and the second pin is a reference pin for a ground reference of the integrated circuit.

8. The ESD protection circuit of claim 6, wherein the first pin is a reference pin for a ground reference of an integrated circuit signal and the second pin is a signal pin for input/output of the integrated circuit.

9. The ESD protection circuit of claim 6, wherein said second SCR device has an avalanche breakdown voltage for self-turn on.

10. The ESD protection circuit of claim 9, wherein both a cathode gate node and an anode gate node of the second SCR device are not connected to a triggering circuit for controlling turn on of the second SCR device.

11. The ESD protection circuit of claim 9, further comprising:
- a second circuit path having a first node and a second node, and wherein said second circuit path has an activation voltage for turn on;
- wherein the second SCR device and second circuit path are connected in parallel; and
- wherein said activation voltage of the second circuit path is less than the avalanche breakdown voltage of the second SCR device.

12. D) The ESD protection circuit of claim 11, wherein:
- said activation voltage of the first circuit path is dependent on M times a reverse breakdown voltage of the first Zener diode; and
- the second circuit path comprises a series connected chain of Mb second Zener diodes that are coupled between the anode terminal and the cathode terminal of the second SCR device, wherein said activation voltage of the second circuit path is dependent on Mb times a reverse breakdown voltage of the second Zener diode.

13. The ESD protection circuit of claim 12, wherein the number M of first Zener diodes in the first circuit path and the number Mb of second Zener diodes in the second circuit path are equal.

14. The ESD protection circuit of claim 12, wherein the number M of first Zener diodes in the first circuit path and the number Mb of second Zener diodes in the second circuit path are not equal.

15. The ESD protection circuit of claim 12, wherein said second circuit path further includes a diode directly connected in series with the series connected chain of Mb second Zener diodes.

* * * * *